(12) United States Patent
Kwon et al.

(10) Patent No.: US 11,683,947 B2
(45) Date of Patent: Jun. 20, 2023

(54) ORGANIC LIGHT EMITTING DISPLAY DEVICE AND METHOD OF MANUFACTURING THE SAME

(71) Applicant: Samsung Display Co., Ltd., Yongin-si (KR)

(72) Inventors: Sungjoo Kwon, Goyang-si (KR); Hyuneok Shin, Gwacheon-si (KR); Juhyun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 17/319,944

(22) Filed: May 13, 2021

(65) Prior Publication Data

US 2022/0085319 A1    Mar. 17, 2022

(30) Foreign Application Priority Data

Sep. 17, 2020 (KR) .................. 10-2020-0119762

(51) Int. Cl.
  *H01L 51/52* (2006.01)
  *H01L 27/32* (2006.01)
  *H01L 51/00* (2006.01)
  *H01L 51/56* (2006.01)
  *H01L 51/50* (2006.01)

(52) U.S. Cl.
  CPC ...... *H01L 51/5218* (2013.01); *H01L 27/3246* (2013.01); *H01L 51/002* (2013.01); *H01L 51/0008* (2013.01); *H01L 51/5088* (2013.01); *H01L 51/5209* (2013.01); *H01L 51/56* (2013.01); *H01L 2251/305* (2013.01); *H01L 2251/306* (2013.01); *H01L 2251/308* (2013.01); *H01L 2251/558* (2013.01)

(58) Field of Classification Search
  CPC ............ H01L 51/5218; H01L 27/3246; H01L 2251/305
  See application file for complete search history.

(56) References Cited

U.S. PATENT DOCUMENTS

| 7,829,890 B2 | 11/2010 | Cho et al. |
| 9,484,553 B2 | 11/2016 | Dai et al. |
| 2021/0313539 A1* | 10/2021 | Jeon .................. H01L 51/5225 |

FOREIGN PATENT DOCUMENTS

| JP | 2018-110109 A | 7/2018 |
| KR | 10-2012-0106192 A | 9/2012 |
| KR | 10-1784994 B1 | 10/2017 |
| KR | 10-1871227 B1 | 8/2018 |

* cited by examiner

*Primary Examiner* — Anthony Ho
(74) *Attorney, Agent, or Firm* — Lewis Roca Rothgerber Christie LLP

(57) ABSTRACT

An organic light emitting display device may include a substrate, a first pixel electrode on the substrate, a pixel defining layer on the substrate, the pixel defining layer having an opening exposing a portion of the first pixel electrode, a second pixel electrode on the portion of the first pixel electrode exposed by the opening, a hole injection layer on the second pixel electrode, the hole injection layer including a metal oxide, an organic light emitting layer on the hole injection layer; and a common electrode on the organic light emitting layer.

8 Claims, 5 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2020-0119762, filed on Sep. 17, 2020 in the Korean Intellectual Property Office (KIPO), the entire content of which is hereby incorporated by reference.

BACKGROUND

1. Field

Embodiments of the present disclosure relate to an organic light emitting display device having improved display characteristics and a method of manufacturing the same.

2. Description of the Related Art

An organic light emitting display device may include two electrodes and a light emitting layer. The light emitting layer may be positioned between the two electrodes. The organic light emitting display device may emit light by combining holes injected from one electrode and electrons injected from another electrode in the light emitting layer. In this case, the electrode (e.g., a pixel electrode) for injecting holes may be formed in each pixel.

A pixel defining layer may be formed on a portion of the pixel electrode. When the pixel defining layer is formed, an organic residue may remain on the pixel electrode. Defects of display characteristics such as image sticking may occur due to the organic residue. Accordingly, a method of forming an additional pixel electrode on the pixel electrode has been studied.

SUMMARY

Some embodiments of the present disclosure provide an organic light emitting display device.

Some embodiments provide a method of manufacturing an organic light emitting display device.

According to one or more embodiments, there is provided an organic light emitting display device including a substrate, a first pixel electrode on the substrate, a pixel defining layer on the substrate, the pixel defining layer having an opening exposing a portion of the first pixel electrode, a second pixel electrode on the first pixel electrode exposed by the opening of the pixel defining layer, a hole injection layer on the second pixel electrode, the hole injection layer including a metal oxide, an organic light emitting layer on the hole injection layer, and a common electrode on the organic light emitting layer.

In one or more embodiments, the second pixel electrode may include a conductive oxide.

In one or more embodiments, the conductive oxide may include indium tin oxide (ITO), indium zinc oxide (IZO), fluorine-doped tin oxide (FTO), aluminum doped zinc oxide (AZO), and/or gallium doped zinc oxide (GZO).

In one or more embodiments, the second pixel electrode may be on an inclined surface of the pixel defining layer, which is defined by the opening.

In one or more embodiments, a width of the second pixel electrode may be greater than a width of the portion of the first pixel electrode exposed through the opening of the pixel defining layer.

In one or more embodiments, a thickness of the second pixel electrode may be 30 angstroms to 100 angstroms.

In one or more embodiments, a width of the hole injection layer may be the same as a width of the second pixel electrode.

In one or more embodiments, the metal oxide may include at least one selected from tungsten oxide ($WO_x$), vanadium oxide ($VO_x$), molybdenum oxide ($MoO_x$), rhodium oxide ($RhO_x$), iridium oxide ($IrO_x$), nickel oxide ($NiO_x$), and cobalt oxide ($CoO_x$).

According to embodiments, there is provided a method of manufacturing an organic light emitting display device, the method including forming a first pixel electrode on a substrate, forming a pixel defining layer on the substrate, the pixel defining layer having an opening exposing a portion of the first pixel electrode, forming a second pixel electrode layer on the portion of the first pixel electrode partially exposed by the opening of the pixel defining layer, forming a preliminary hole injection layer on the second pixel electrode layer, forming a photoresist pattern on a portion of the preliminary hole injection layer, forming a hole injection layer and a second pixel electrode after etching the preliminary hole injection layer and the second pixel electrode layer using the photoresist pattern, forming an organic light emitting layer on the hole injection layer and forming a common electrode on the organic light emitting layer.

In one or more embodiments, the method may further include removing the photoresist pattern on the hole injection layer after forming the hole injection layer and the second pixel electrode.

In one or more embodiments, the hole injection layer may include a metal oxide.

In one or more embodiments, the metal oxide may include at least one selected from $WO_x$, $VO_x$, $MoO_x$, $RhO_x$, $IrO_x$, $NiO_x$, and $CoO_x$.

In one or more embodiments, the second pixel electrode layer and the preliminary hole injection layer may be formed by sputtering.

In one or more embodiments, the second pixel electrode may be formed on an inclined surface of the pixel defining layer defined by the opening.

In one or more embodiments, a width of the second pixel electrode may be greater than a width of the portion of the first pixel electrode exposed through the opening of the pixel defining layer.

In one or more embodiments, a thickness of the second pixel electrode may be 30 angstroms to 100 angstroms.

In one or more embodiments, the pixel defining layer may include crosslinked polymer compound.

In one or more embodiments, the second pixel electrode may include a conductive oxide.

In one or more embodiments, the conductive oxide may include ITO, IZO, FTO, AZO, and/or GZO.

As described above, the organic light emitting display device according to embodiments may include the first pixel electrode, the pixel defining layer including the opening, the second pixel electrode, the hole injection layer including the metal oxide and the organic light emitting layer.

An organic residue generated when the pixel defining layer is formed may not be present (or may not be noticeably present) on the second pixel electrode. Accordingly, the hole injection layer on the second pixel electrode may not be affected (or may not be substantially affected) by the organic residue. Accordingly, holes moving to the hole injection layer through the second pixel electrode may not be affected (or may not be substantially affected) by the organic residue. As a result, image sticking may be prevented or reduced and display characteristic of the organic light emitting display device may be improved.

The hole injection layer may include a material having a large work function, for example, a metal oxide. Accordingly, the number of holes moving to the light emitting layer through the hole injection layer may increase. As a result, display characteristic of the organic light emitting display device may be improved.

As described above, in the method of manufacturing the organic light emitting display device according to embodiments, the second pixel electrode and the hole injection layer may be formed using a single photoresist pattern. Accordingly, mass-production of the organic light emitting display device having improved display characteristic may be possible.

BRIEF DESCRIPTION OF THE DRAWINGS

Illustrative, non-limiting embodiments will be more clearly understood from the following detailed description in conjunction with the accompanying drawings.

DETAILED DESCRIPTION

Hereinafter, embodiments of the present disclosure will be explained in more detail with reference to the accompanying drawings.

Figure 1:
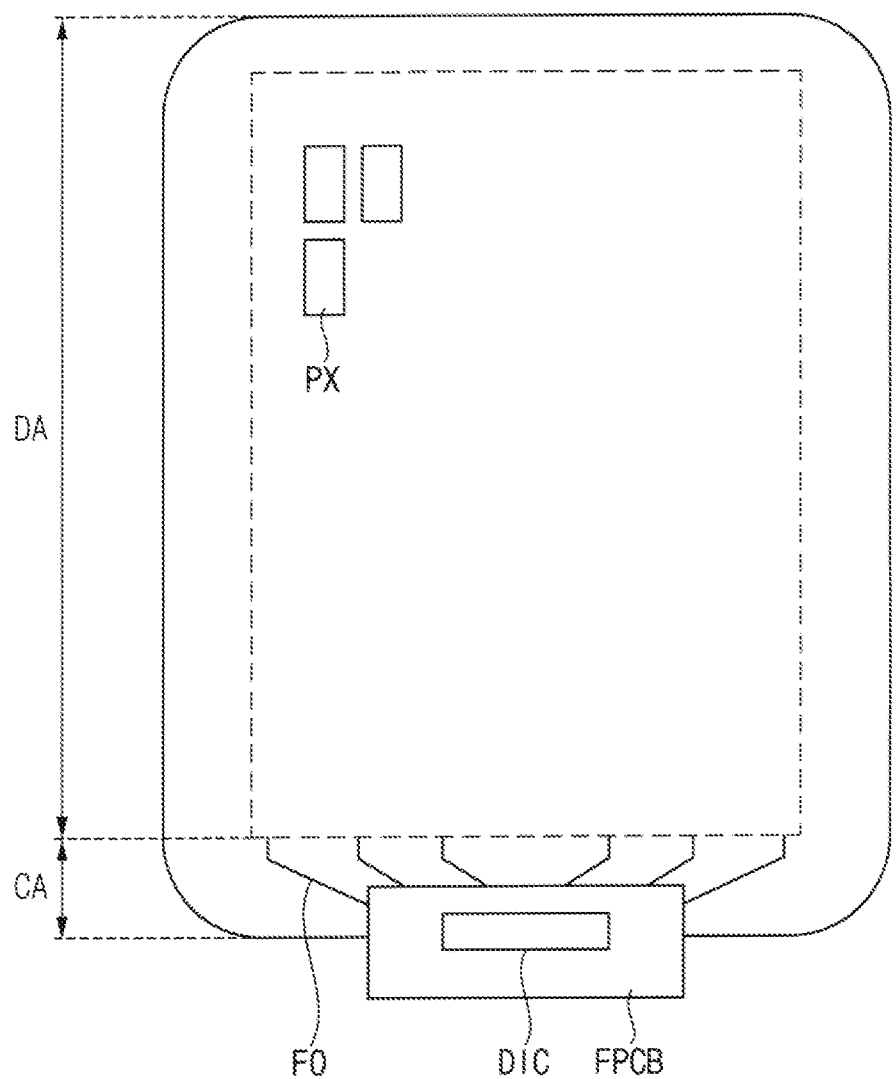
FIG. 1 is a plan view illustrating an organic light emitting display device according to embodiments.

FIG. 1 is a plan view illustrating an organic light emitting display device according to one or more embodiments.

Referring to FIG. 1, an organic light emitting display device 100 may include a display area DA and a circuit area CA adjacent to the display area DA. Pixels PX may be in the display area DA, and an image may be displayed in the display area DA. A circuit board, a driving circuit and a driving wiring may be in the circuit area CA. For example, a flexible printed circuit board FPCB, a data driving circuit DIC disposed on the flexible printed circuit board FPCB and a fan-out wiring FO connecting the data driving circuit DIC and pixels PX may be in the circuit area CA. Each of the pixels PX may include at least one thin film transistor and an organic light emitting layer (the organic light emitting layer 250 of FIG. 2). The thin film transistor may be electrically coupled to the organic light emitting layer. The thin film transistor may receive a data driving signal transmitted by the data driving circuit DIC and may transmit the data driving signal to the organic light emitting layer. The organic light emitting layer may display an image by emitting light by varying the intensity of light (for example, luminance) according to the data driving signal. The organic light emitting layer may emit light having a luminance corresponding to the intensity of the data driving signal.

Figure 2:
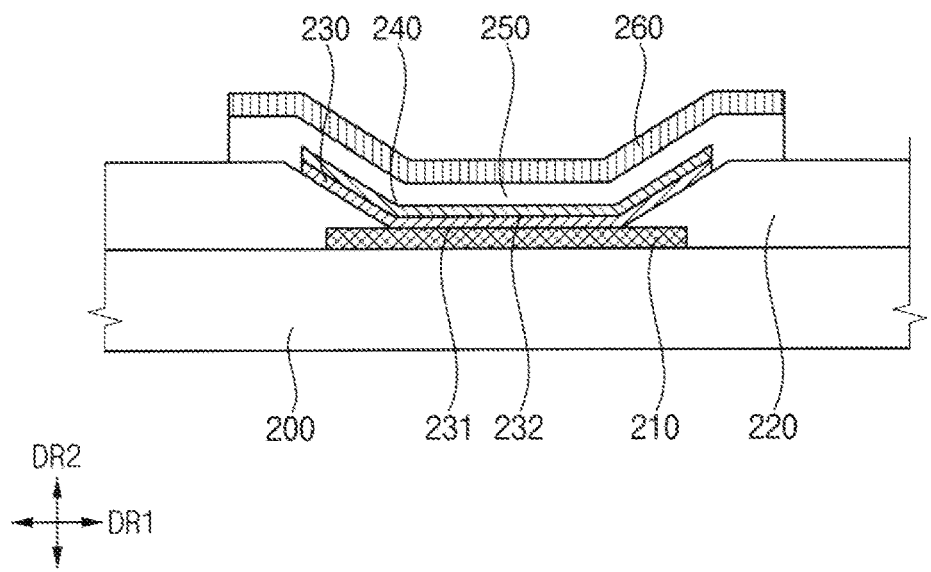
FIG. 2 is a cross-sectional view illustrating a pixel included in the organic light emitting display device of FIG. 1.

FIG. 2 is a cross-sectional view illustrating a pixel included in the organic light emitting display device of FIG. 1.

Referring to FIG. 2, the pixel PX may include a substrate 200, a first pixel electrode 210, a pixel defining layer 220, a second pixel electrode 230, a hole injection layer 240, an organic light emitting layer 250 and a common electrode 260.

The substrate 200 may be formed of a glass material such as transparent material containing silicon dioxide (SiO2) as a main component. In one or more embodiments, the substrate 200 may be formed of various suitable materials such as a transparent plastic material and/or a metal material. The substrate 200 may include at least one thin film transistor for each pixel. One selected from the source and drain electrode of the thin film transistor is electrically coupled to at least a portion of the first pixel electrode 210. Accordingly, the data driving signal transmitted by the data driving circuit DIC may be transmitted to the first pixel electrode 210 through the thin film transistor. For example, the data driving signal may be expressed by a pattern through which holes are transmitted. The holes may be transmitted to the first pixel electrode 210 through source and drain electrodes of the thin film transistor. The thin film transistor may be in a region overlapping the first pixel electrode on the substrate 200. In one or more embodiments, the thin film transistor may be in a region other than the region in which the first pixel electrode 210 is located.

The first pixel electrode 210 may be on the substrate 200. The first pixel electrode 210 may be a transparent electrode, a translucent electrode or a reflective electrode. The first pixel electrode 210 may be formed by sequentially stacking a first conductive oxide layer, a metal layer, and a second conductive oxide layer. In one or more embodiments, the metal layer may include silver (Ag), aluminum (Al), and/or copper (Cu). In one or more embodiments, the first conductive oxide layer and the second conductive oxide layer may each independently include indium tin oxide (ITO), indium zinc oxide (IZO), fluorine-doped tin oxide (FTO), aluminum doped zinc oxide (AZO), and/or gallium doped zinc oxide (GZO).

The pixel defining layer 220 including an opening exposing a portion of the first pixel electrode 210 may be on the substrate 200. The pixel defining layer 220 may electrically insulate neighboring pixels PX and may define an emitting region of the organic light emitting layer 250. The pixel defining layer 220 may be formed of an organic material. The pixel defining layer 220 may be formed by applying an organic layer on the substrate 200 and the first pixel electrode 210 and then patterning the organic layer. In this case, an organic residue used when the pixel defining layer 220 is formed may remain on the first pixel electrode 210. When the organic light emitting layer 250 is formed on the organic residue, a defect in display characteristics such as image sticking may occur. A plasma process using oxygen gas and/or nitrogen gas may be additionally performed to remove the organic residue, but in this case, an additional process is required. In addition, when the plasma process is performed, the oxygen gas and/or the nitrogen gas may affect the electrical characteristics of a conductive oxide constituting the first pixel electrode 210.

The second pixel electrode 230 may be on the first pixel electrode 210 partially exposed by the opening of the pixel defining layer 220. The data driving signal may be transmitted to the second pixel electrode 230 through the first pixel electrode 210. The organic residue may remain on a first surface 231 where the second pixel electrode 230 and the first pixel electrode 210 contact, and the organic residue may not remain on a second surface 232 opposite to the first surface. Accordingly, the hole injection layer 240 on the second surface 232 of the second pixel electrode 230 may not be affected by the organic residue and problems such as image sticking may not occur. The second pixel electrode 230 may include a conductive oxide. For example, the second pixel electrode 230 may include indium tin oxide (ITO), indium zinc oxide (IZO), fluorine-doped tin oxide (FTO), aluminum doped zinc oxide (AZO), and/or gallium doped zinc oxide (GZO).

In embodiments, the second pixel electrode 230 may also be partially on the pixel defining layer 220. In other words, the second pixel electrode 230 may be on an inclined surface of the pixel defining layer 220 defined by the opening. In addition, an width of the second pixel electrode 230 in a first direction DR1 may be larger than an width of the first pixel electrode 210 exposed by the opening of the pixel defining layer 220 in the first direction DR1. Accordingly, an area of the second pixel electrode 2330 may be wider and the data driving signal received from the thin film transistor may be better transmitted to the hole injection layer 240 through the second pixel electrode 230.

In one or more embodiments, a thickness of the second pixel electrode 230 may be about 30 angstroms to about 100 angstroms. Because a size of the organic residue on the first pixel electrode 210 is within about 30 angstroms, when the thickness of the second pixel electrode 230 is within about 30 angstroms, the organic residue may penetrate the second pixel electrode 230. In this case, problems such as image sticking may occur. When the thickness of the second pixel electrode 230 is greater than about 100 angstroms, reflectance of light emitted from the organic light emitting layer 250 may be lowered. This will be further described herein below with reference to FIG. 3.

The hole injection layer 240 may be on the second pixel electrode 230 and may contain a metal oxide. Since the hole injection layer 240 contains the metal oxide having a high work function, less energy may be consumed when holes are transferred to the organic light emitting layer 250. For example, an act of transferring the holes transferred to the hole injection layer 240 through the second pixel electrode 230 to the organic light emitting layer 250 may include a first act in which the holes are transferred to the hole injection layer 240 through the second pixel electrode 230 and a second act in which the holes are transferred to the organic light emitting layer 250 through the hole injection layer 240. An energy change of the hole in the first act and the second act may be smaller than an energy change when the hole is transferred to the organic light emitting layer 250 through the second pixel electrode 230. Accordingly, when the hole injection layer 240 is present, the holes may be easily transferred from the second pixel electrode 230 to the organic light emitting layer 250.

In one or more embodiments, the metal oxide may include at least one selected from tungsten oxide, vanadium oxide, molybdenum oxide, rhodium oxide, iridium oxide, nickel oxide, and cobalt oxide. In addition, a width of the hole injection layer 240 may be same as a width of the second pixel electrode 230.

The organic light emitting layer 250 may be on the hole injection layer 240. The common electrode 260 may be on the organic light emitting layer 250. Optionally, the common electrode 260 may cover the organic light emitting layer 250 and the pixel defining layer 220. In the organic light emitting layer 250, holes transmitted through the hole injection layer 240 and electrons transmitted through the common electrode 260 may meet to form excitons. The excitons may emit light while emitting energy. Optionally, the organic light emitting display device 100 may include an electron transport layer and an electron injection layer disposed between the organic light emitting layer 250 and the common electrode 260. In addition, the organic light emitting display device 100 may include a hole transport layer between the hole injection layer 240 and the organic light emitting layer 250.

Figure 3:
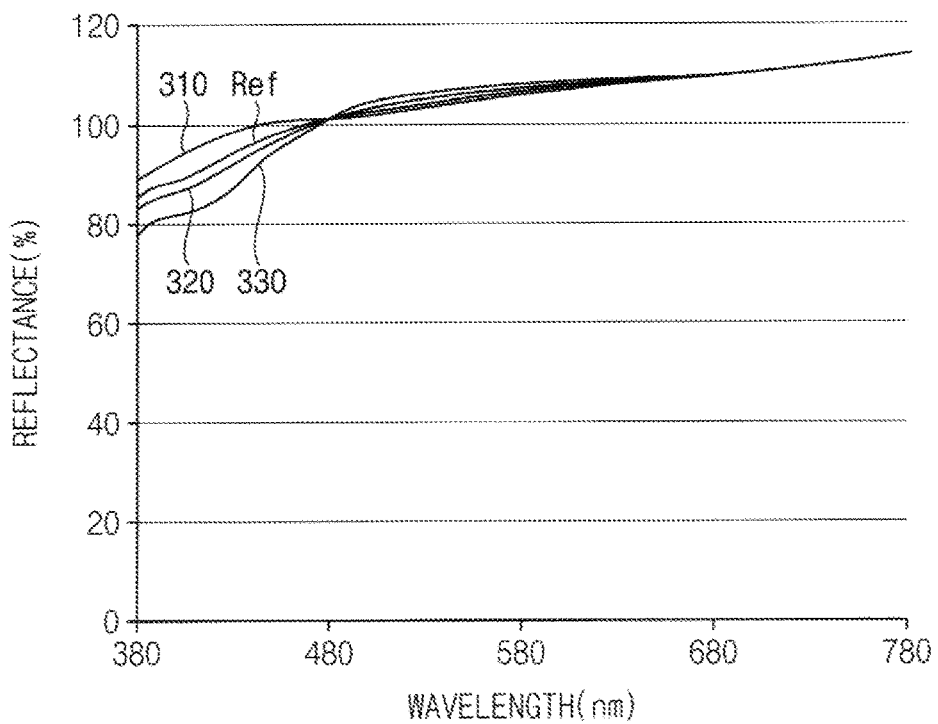
FIG. 3 is a drawing illustrating reflectance according to a thickness of a second pixel electrode included in the organic light emitting display device of FIG. 2.

FIG. 3 is a drawing illustrating reflectance according to a thickness of a second pixel electrode included in the organic light emitting display device of FIG. 2.

Referring to FIG. 3, a graph of FIG. 3 shows a reflected light after irradiating light of various suitable wavelengths on the first pixel electrode 210 and the second pixel electrode 230 on the first pixel electrode 210. The results measured with a spectrometer are shown in FIG. 3. Comparative example (Ref) includes the first pixel electrode 210 composed of an ITO layer having a thickness of about 70 angstroms, an Ag layer having a thickness of about 50 angstroms and an ITO layer having a thickness of about 70 angstroms stacked in sequence and does not include the second pixel electrode 230.

A first experimental example 310 includes the first pixel electrode composed of an ITO layer having a thickness of about 70 angstroms, an Ag layer having a thickness of about 50 angstroms and an ITO layer having a thickness of about 20 angstroms stacked in sequence and the second pixel electrode 230 composed of an ITO layer having a thickness of about 20 angstroms.

A second experimental example 320 includes the first pixel electrode composed of an ITO layer having a thickness of about 70 angstroms, an Ag layer having a thickness of about 50 angstroms and an ITO layer having a thickness of about 20 angstroms stacked in sequence and the second pixel electrode 230 composed of an ITO layer having a thickness of about 70 angstroms.

A third experimental example 330 includes the first pixel electrode composed of an ITO layer having a thickness of about 70 angstroms, an Ag layer having a thickness of about 50 angstroms and an ITO layer having a thickness of about 20 angstroms stacked in sequence and the second pixel electrode 230 composed of an ITO layer having a thickness of about 100 angstroms.

When referring to the graph of FIG. 3, in a wavelength region of light shown on an x-axis of the graph, a reflectivity of the first experimental example 310, a reflectivity of the second experimental example 320 and a reflectivity of the third experimental example 330 do not differ significantly from a reflectivity of the comparative example Ref. When the ITO layer of the second pixel electrode 230 has a thickness greater than 100 angstroms, the reflectivity may decrease. Accordingly, some of the light emitted from the organic light emitting layer 250 is absorbed by the ITO layer of the second pixel electrode 230 and the ITO layer of the first pixel electrode 210, so that a luminous efficiency of the organic light emitting layer 250 may be reduced.

FIGS. 4, 5, 6, 7, and 8 are cross-sectional views illustrating a method of manufacturing an organic light emitting display device according to one or more embodiments.

Figure 4:
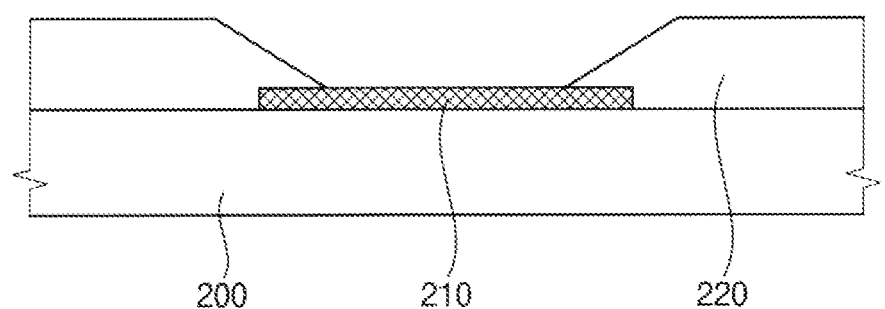
FIGS. 4, 5, 6, 7, and 8 are cross-sectional views illustrating a method of manufacturing an organic light emitting display device according to embodiments.

Referring to FIG. 4, a first pixel electrode 210 may be formed on a substrate 200. The first pixel electrode 210 may be formed by sequentially stacking a first conductive oxide layer, a metal layer, and a second conductive oxide layer. In addition, a pixel defining layer 220 having an opening exposing a portion of the first pixel electrode 210 may be formed on the substrate 200. The pixel defining layer 220 may include an organic material. The pixel defining layer 220 may be formed by completely applying an organic layer on the substrate 200 and the first pixel electrode 210 and then patterning the organic layer. In this case, an organic residue used when the pixel defining layer 220 is formed may remain on the first pixel electrode 210.

Figure 5:
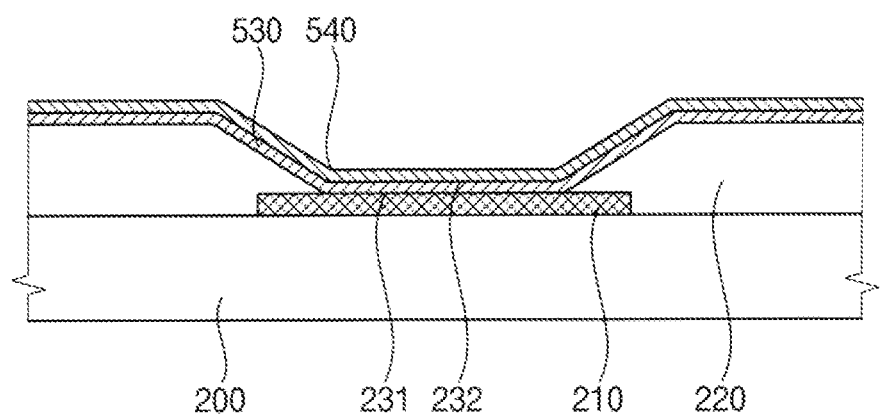

Referring to FIG. 5, a second pixel electrode layer 230 may be formed on the first pixel electrode 210 partially exposed by the opening. Thereafter, a preliminary hole injection layer 540 may be formed on the second pixel electrode layer 530. The second pixel electrode layer 530 and the preliminary hole injection layer 540 may be formed by a sputtering method. In embodiments, the preliminary hole injection layer 540 may include a metal oxide having a high work function. The metal oxide may include at least one selected from $WO_x$, $VO_x$, $MoO_x$, $RhO_x$, $IrO_x$, $NiO_x$, and $CoO_x$.

In one or more embodiments, the metal oxide may be deposited on the second pixel electrode layer 530 by a sputtering method to form the preliminary hole injection layer 540.

In embodiments, a metal included in the metal oxide may be deposited on the second pixel electrode layer 530 by a reactive sputtering method to form the preliminary hole injection layer 540.

Figure 6:
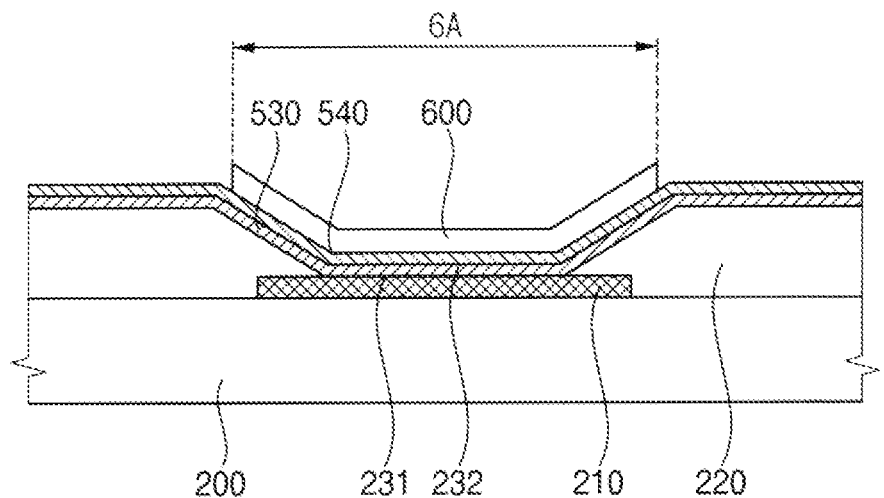

Referring to FIG. 6, a photoresist pattern 600 may be formed in a first region 6A on the preliminary hole injection layer 540. The photoresist pattern 600 may include a polymer material that is cured when exposed to light.

Figure 7:
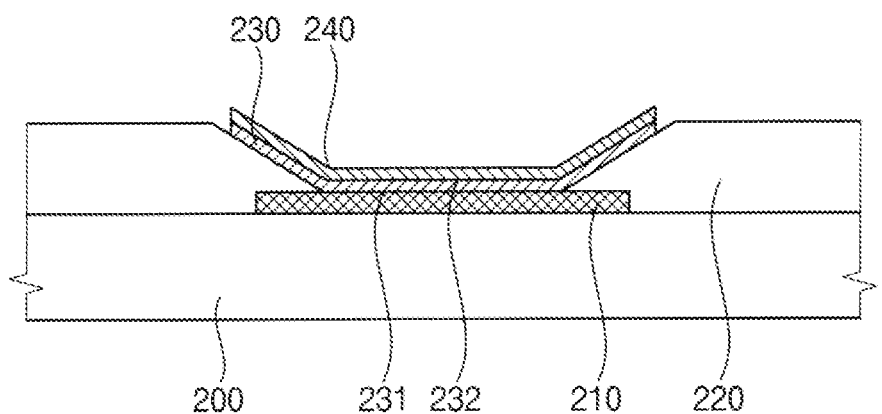

Referring to FIG. 7, the preliminary hole injection layer 540 and the second pixel electrode layer 530 may be etched in the same pattern as the photoresist pattern 600. Accordingly, the preliminary hole injection layer 540 and the second pixel electrode layer 530 on the first region 6A may be a hole injection layer 240 and a second pixel electrode 230, respectively. The preliminary hole injection layer 540 and the second pixel electrode layer 530 that do not overlap with the first region 6A may be removed. Thereafter, the photoresist pattern 600 may be removed by applying a developer. In this case, when the developer reacts with the pixel defining layer 220 containing a polymer material, a phenomenon in which the pixel defining layer 220 swells may occur. Accordingly, an area of the opening may be reduced and display characteristic may be deteriorated or degraded. In embodiments, the pixel defining layer 220 may include a cross-linked polymer compound. The crosslinked polymer compound may not swell (e.g., may not noticeably swell) even if it reacts with the developer.

Figure 8:
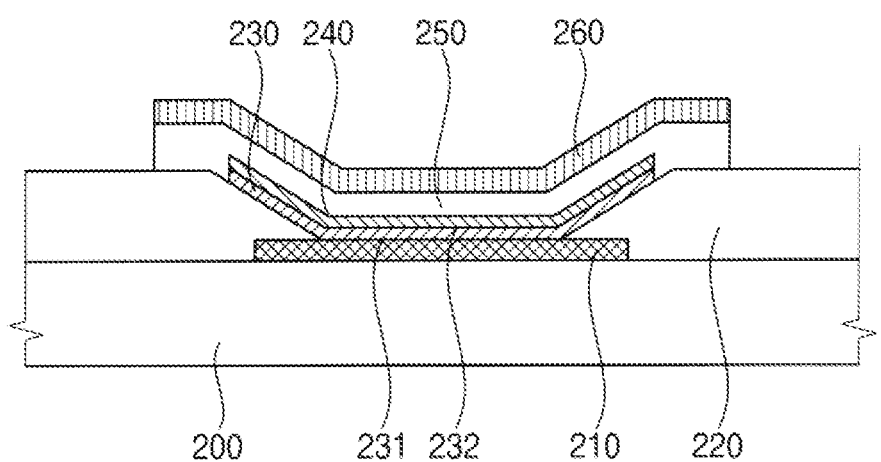

Referring to FIG. 8, an organic light emitting layer 250 may be formed on the hole injection layer 240. Thereafter, a common electrode 260 may be formed on the organic light emitting layer 250.

The subject matter of the present disclosure may be applied to any suitable organic light emitting display device and an electronic device including the same. For example, the subject matter of the present disclosure may be applied to a high-resolution smartphone, a mobile phone, a smart pad, a smart watch, a tablet PC, a vehicle navigation system, a television, and/or a computer monitor, etc.

The foregoing is illustrative of embodiments of the present disclosure and is not to be construed as limiting thereof. Although a few embodiments have been described, those skilled in the art will readily appreciate that many modifications are possible in the embodiments without materially departing from the spirit and scope of the present disclosure. Accordingly, all such modifications are intended to be included within the scope of the present disclosure as defined in the claims, and equivalents thereof. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and equivalents thereof.

What is claimed is:

1. An organic light emitting display device comprising:
a substrate;
a first pixel electrode on the substrate;
a pixel defining layer on the substrate, the pixel defining layer having an opening exposing a portion of the first pixel electrode;
a second pixel electrode on the portion of the first pixel electrode exposed by the opening of the pixel defining layer;
a hole injection layer on the second pixel electrode, the hole injection layer comprising a metal oxide;
an organic light emitting layer on the hole injection layer; and
a common electrode on the organic light emitting layer.

2. The organic light emitting display device of claim 1, wherein the second pixel electrode comprises a conductive oxide.

3. The organic light emitting display device of claim 2, wherein the conductive oxide comprises indium tin oxide (ITO), indium zinc oxide (IZO), fluorine-doped tin oxide (FTO), aluminum doped zinc oxide (AZO), and/or gallium doped zinc oxide (GZO).

4. The organic light emitting display device of claim 1, wherein the second pixel electrode is on an inclined surface of the pixel defining layer, which is defined by the opening.

5. The organic light emitting display device of claim 4, wherein a width of the second pixel electrode is greater than a width of the portion of the first pixel electrode exposed through the opening of the pixel defining layer.

6. The organic light emitting display device of claim 1, wherein a thickness of the second pixel electrode is 30 angstroms to 100 angstroms.

7. The organic light emitting display device of claim 1, wherein a width of the hole injection layer is the same as a width of the second pixel electrode.

8. The organic light emitting display device of claim 1, wherein the metal oxide comprises at least one selected from tungsten oxide ($WO_x$), vanadium oxide ($VO_x$), molybdenum oxide ($MoO_x$), rhodium oxide ($RhO_x$), iridium oxide ($IrO_x$), nickel oxide ($NiO_x$), and cobalt oxide ($CoO_x$).

* * * * *